United States Patent
Nakajima

[11] Patent Number: 5,935,744
[45] Date of Patent: Aug. 10, 1999

[54] METHOD OF DRAWING PATTERNS THROUGH ELECTRON BEAM EXPOSURE UTILIZING TARGET SUBPATTERNS AND VARIED EXPOSURE QUANTITY

[75] Inventor: Ken Nakajima, Tokyo, Japan

[73] Assignee: NEC Corporation, Tokyo, Japan

[21] Appl. No.: 08/982,647

[22] Filed: Dec. 2, 1997

[30] Foreign Application Priority Data

Dec. 26, 1996 [JP] Japan ................................ 8-349000

[51] Int. Cl.$^6$ .............................. G03F 9/00; G03C 5/00
[52] U.S. Cl. ......................... 430/30; 430/296; 430/942
[58] Field of Search ............................ 430/30, 296, 942

[56] References Cited

U.S. PATENT DOCUMENTS 5,700,604 12/1997 Okino ..................................... 430/296

FOREIGN PATENT DOCUMENTS 5-217870  8/1993  Japan .

*Primary Examiner*—Christopher G. Young
*Attorney, Agent, or Firm*—Laff, Whitesel, Conte & Saret, Ltd.

[57] ABSTRACT

In a method of drawing patterns by an electron beam exposure apparatus, a target pattern is divided into subpatterns and one of the subpatterns is sequentially selected. The dimensions of the selected subpattern are compared with dimensions of a reference electron beam which are determined in accordance with design dimensions. When at least one of the dimensions of the selected subpattern is not larger than the corresponding one of the dimensions of the reference electron beam, dimensions of the use electron beam for the selected subpattern are estimated. Also, the use exposure quantity for the selected subpattern is determined based on the estimated dimensions of the use electron beam for the selected subpattern. Then, the use electron beam is irradiated to the subpattern with the use exposure quantity.

19 Claims, 7 Drawing Sheets

1 DESIRED EXPOSURE PATTERN

2 MAXIMUM SHOT AREA OF SQUARE ELECTRON BEAM

MAXIMUM ELECTRON BEAM SHOT DIMENSION

LOWER SUBSTRATE

ORIGINAL SIGNAL 9

PRIMARY DIFFERENTIAL SIGNAL 10

SECONDARY DIFFERENTIAL SIGNAL 11

BEAM DIMENSION

21 DESIRED EXPOSURE PATTERN

MAXIMUM ELECTRON BEAM SHOT DIMENSION

22 MAXIMUM SHOT AREA OF SQUARE ELECTRON BEAM

EXPOSING ORDER →

METHOD OF DRAWING PATTERNS THROUGH ELECTRON BEAM EXPOSURE UTILIZING TARGET SUBPATTERNS AND VARIED EXPOSURE QUANTITY

BACKGROUND OF THE INVENTION

1. Field of the Invention

The present invention relates to a method for exposing a pattern with an electron beam in a manufacturing process of a semiconductor integrated circuit, and more particularly to a method for drawing a desired pattern directly in a photoresist using a variably formed electron beam.

2. Description of the Related Art

As the high integration and fine pattern formation of a semiconductor integrated circuit have been developed in recent years, an electron beam drawing system is considered in place of a conventional exposure system using light in the photo-lithography technique. In the electron beam drawing system, a pattern is drawn directly on a photoresist film using an electron beam. Also, in the electron beam drawing system, there are two systems, a spot-shaped electron beam system and a variably formed electron beam system, depending upon the shape of the electron beam.

FIGS. 1A to 1D are diagrams illustrating a drawing method in the variably formed electron beam system. It is supposed that a desired exposure pattern 1 shown in FIG. 1A is exposed using the variably formed electron beam. An electron beam drawing apparatus has the maximum shot size of t×t which is the value peculiar to the apparatus, as shown in FIG. 1B. In this case, it is necessary to divide the exposure pattern 1 into rectangles having a size smaller than the maximum shot size, as shown in FIG. 1C. In other words, when the size of desired exposure pattern 1 is larger than the maximum shot size, the exposure pattern 1 can not be exposed at once. Therefore, the exposure pattern 1 is divided into rectangular patterns A, B, C, D, E, F, G, and H which have the size smaller than the maximum shot size, as shown in FIG. 1C. Then, the exposing process is performed by a rectangular electron beam with this size.

The pattern dividing process is performed by a rectangle dividing unit when the designed exposure pattern data is converted into a format peculiar to the electron beam exposure apparatus, or by a shot dividing unit in the electron beam drawing apparatus. Also, in the pattern dividing process, the exposure pattern is mechanically divided in the X axis direction and the Y axis direction.

Therefore, the rectangular pattern obtained through the pattern dividing process sometimes as an extremely small width than the maximum shot width t, as the rectangular pattern D shown in FIG. 1C.

Conventionally, even when such a small rectangular pattern D is generated, the exposure is performed with a reference light exposure quantity which has been previously fixedly determined. The reference light exposure quantity is applied to the other rectangular patterns A to C, and E to H. Also, the size of the used rectangular electron beam has been determined based on electron beam size calibration which is performed previously.

In this way, in the conventional electron beam exposure system using the variably formed electron beam, even if the small rectangular pattern is formed through the pattern dividing process, the drawing process is performed with the same exposure light quantity to all the rectangular patterns using the rectangular electron beam with the same beam size which has been previously calibrated in the size.

For this reason, the exposure light quantity is lack in the small rectangular pattern. As shown in FIG. 1D illustrating a cross section of the photoresist pattern when the photoresist pattern is cut along the line X—X in FIG. 1C, the resolution in the rectangular photoresist pattern 3D corresponding to the rectangular pattern D is lack after the drawing process. Thus, the drawing size precision of the electron beam is decreased consequently.

The size calibration of the rectangular electron beam will be described below. FIG. 2A shows a size measuring method (edge method) conventionally used for the size calibration of the variably formed electron beam. In this size measuring method, the incident rectangular electron beam 5 is scanned on a step mark 6 for calibration, and the reflected electrons 7 are detected by a reflection electron detector 8 to measure the size of the scanned electron beam.

At this time, as shown in FIGS. 2B to 2D, the detected original signal 9 is subjected the primary differentiation or the secondary differentiation to generate a signal 10 or a signal 11. Thus, the size calibration of the rectangular electron beam 5 is performed. It should be noted that the signal waveforms shown in FIGS. 2C and 2D are theoretical waveforms. The actual differentiated waveform has a broader waveform because of signal noise.

In case of this size calibrating method, because the number of incident electrons decreases as the size of the rectangular electron beam becomes small, the strength of the obtained reflection electron signal also decreases. As a result, the S/N ratio of the reflection electron signal becomes so small that it is difficult to precisely measure the size of the electron beam. Therefore, the size calibration precision is lack for the small pattern.

For this reason, in the actual size calibration, the rectangular electron beam having the size of equal to or more than 0.5 $\mu$m for the size calibration. Then, the size calibration of the electron beam is performed based on a size curve extrapolated using a plurality of measured values. In this manner, because the size of the electron beam equal to or less than 0.5 $\mu$m is determined based on the extrapolated calibration curve, the size precision decreases as the size of the electron beam become small.

The line width of an isolated photo-resist pattern is actually measured after the size of the rectangular electron beam is calibrated and then the pattern drawing process is performed to the photo-resist pattern with an exposure light quantity. As a result, nevertheless the size calibration of the electron beam is performed, the size of the electron beam abruptly becomes small from the size of 0.17 $\mu$m.

In other words, when a small pattern was exposed, the size of the rectangular electron beam calibrated for the small pattern is smaller than a desired size of the electron beam for the small pattern. It is found that the exposure light quantity is lack if a small size pattern is exposed with the same exposure light quantity as the exposure light quantity when a larger size pattern is exposed.

In Japanese Laid Open Patent Disclosure (JP-A-Heisei 5-217870), a method is disclosed in which a proximity effect table is provided for every pattern size and the size of an electron beam is corrected based on proximity effect.

In recent years, the formation of a fine pattern having the size equal to or less than 0.20 $\mu$m is required with the high integration and fine processing of a semiconductor device. Therefore, in this case, the size precision equal to or less than 0.02 $\mu$m which is ±10% of the design size is required. For this reason, it is necessary and indispensable to avoid the size calibration lack which is the cause of the decrease of this size precision.

SUMMARY OF THE INVENTION

A present invention was accomplished to solve above-mentioned problem. Therefore, an object of the present invention is to provide a method of exposing a pattern with a variably formed electron beam, in which resolution and size precision of a pattern can be improved.

In order to achieve an aspect of the present invention, a method of drawing patterns by an electron beam exposure apparatus, includes the steps of:

dividing a target pattern into subpatterns;

sequentially selecting one of the subpatterns;

comparing dimensions of the selected subpattern with dimensions of a reference electron beam which are determined in accordance with design dimensions;

when each of the dimensions of the selected subpattern is larger than a corresponding one of the dimensions of the reference electron beam, determining the reference electron beam as a use electron beam for the selected subpattern and a reference exposure quantity predetermined from the design dimensions as a use exposure quantity;

when at least one of the dimensions of the selected subpattern is not larger than the corresponding one of the dimensions of the reference electron beam, estimating dimensions of the use electron beam for the selected subpattern;

when at least one of the dimensions of the selected subpattern is not larger than the corresponding one of the dimensions of the reference electron beam, determining the use exposure quantity for the selected subpattern based on the estimated dimensions of the use electron beam for the selected subpattern; and irradiating the use electron beam to the subpattern with the use exposure quantity.

Here, an exposure time is determined as the use exposure quantity for the selected subpattern. the use exposure time is determined dependent upon an acceleration voltage of the use electron beam, in addition to the dimensions of the selected subpattern.

The determining step may include referring to an exposure quantity table based on the dimensions of the selected subpattern to retrieve an offset exposure quantity for the selected subpattern, and adding the offset exposure quantity to the reference exposure quantity to determine the use exposure quantity for the selected subpattern.

Alternatively, the determining step may include calculating the use exposure quantity based on the dimensions of the selected subpattern and an acceleration voltage of the use electron beam.

In order to achieve another aspect of the present invention, a method of drawing patterns by an electron beam exposure apparatus, includes the steps of:

dividing a target pattern into subpatterns;

sequentially selecting one of the subpatterns;

comparing dimensions of the selected subpattern with dimensions of a reference electron beam which are determined in accordance with design dimensions;

when each of the dimensions of the selected subpattern is larger than a corresponding one of the dimensions of the reference electron beam, determining the dimensions of the reference electron beam for the selected subpattern as dimensions of a use electron beam;

when at least one of the dimensions of the selected subpattern is not larger than the corresponding one of the dimensions of the reference electron beam, determining the dimensions of the use electron beam based on the selected subpattern; and irradiating the use electron beam to the subpattern.

In this case, the dimensions of the use electron beam for the selected subpattern is determined based on the dimensions of the subpattern and an acceleration voltage of the use electron beam.

The determining step may include estimating the dimensions of the use electron beam based on the dimensions of the reference electron beam and the dimensions of the selected subpattern, referring to an offset beam size table based on the dimensions of the selected subpattern to retrieve an offset beam dimension for the selected subpattern, and adding the offset beam dimension to one of the dimensions of the estimated dimensions to determine the dimensions of the use electron beam for the selected subpattern.

Alternatively, the determining step may include calculating the dimensions of the use electron beam based on the dimensions of the selected subpattern and an acceleration voltage of the use electron beam.

In order to achieve still another aspect of the present invention, a method of drawing patterns by an electron beam exposure apparatus, includes the steps of:

dividing a target pattern into subpatterns;

estimating an exposure condition of a use electron beam for each of the subpatterns based on dimensions of each of the subpatterns and an acceleration voltage of the use electron beam;

correcting the estimated exposure condition of the use electron beam for each of the subpatterns; and irradiating the subpatterns by the use electron beam with the corrected exposure conditions, respectively.

The estimating step may include estimating the exposure condition of the use electron beam for each of the subpatterns based on a calibration exposure condition of a calibration electron beam, which are determined in accordance with design dimensions, in addition to the dimensions of each of the subpatterns and the acceleration voltage of the use electron beam.

Here, the exposure condition is an exposure quantity. In this case, the estimating step may include comparing dimensions of each of the subpatterns with the dimensions of the calibration electron beam, when at least one of the dimensions of each of the subpatterns is not larger than the corresponding one of the dimensions of the calibration electron beam, estimating the exposure condition of the use electron beam. The estimating step includes determining an exposure time as the exposure quantity for each of the subpatterns. The correcting step may include referring to an exposure quantity table based on the dimensions of each of the subpatterns to retrieve an offset exposure quantity for each of the subpatterns, and adding the offset exposure quantity to a calibration exposure quantity to correct the exposure quantity for each of the subpatterns.

The exposure condition may be dimensions of the use electron beam. In this case, the determining step may include referring to an offset beam size table based on the dimensions of each of the subpatterns to retrieve an offset beam dimension for each of the subpatterns, and adding the offset beam dimension to one of the dimensions of the estimated dimensions of the use electron beam to correct the dimensions of the use electron beam for each of the subpatterns.

The irradiating step includes controlling a deflector based on the exposure quantity, or controlling an aperture based on the corrected dimensions of the use electron beam.

DESCRIPTION OF THE PREFERRED EMBODIMENT

Next, a method of exposing a pattern with an electron beam of the present invention will be described below in detail with reference to the accompanying drawings.

Figure 1A:
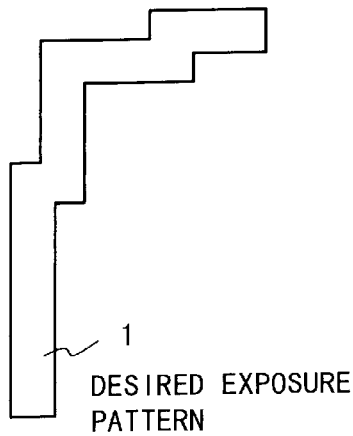
FIG. 1A is a diagram illustrating a desired pattern.
Figure 1B:
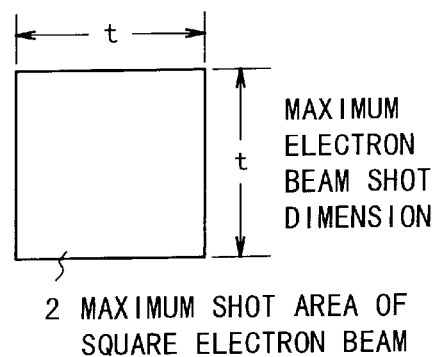
FIG. 1B is a diagram illustrating the maximum shot size of an electron beam in a conventional electron beam exposure system.
Figure 1C:
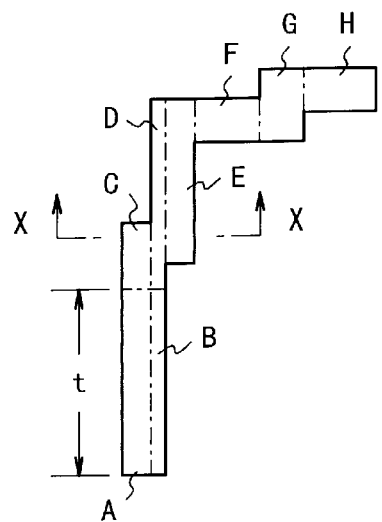
FIG. 1C is a diagram illustrating the state in which the desired pattern is divided into a plurality of rectangular patterns in the conventional electron beam exposure system.
Figure 1D:
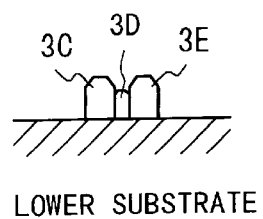
FIG. 1D is a cross sectional view of a photo-resist pattern when the photo-resist is exposed and cut along the line X—X in FIG. 1C.
Figure 2A:
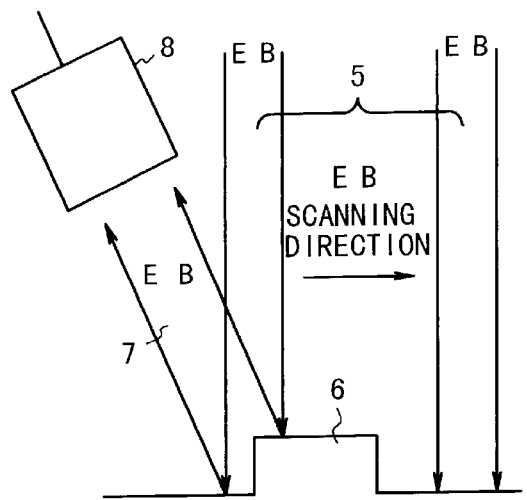
FIG. 2A is a diagram illustrating a beam size calibration procedure in the conventional electron beam exposure system.
Figure 2B:
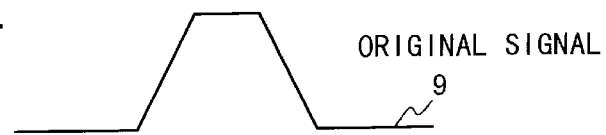
FIG. 2B is a theoretical original signal of reflection electrons detected when an electron beam is scanned.
Figure 2C:
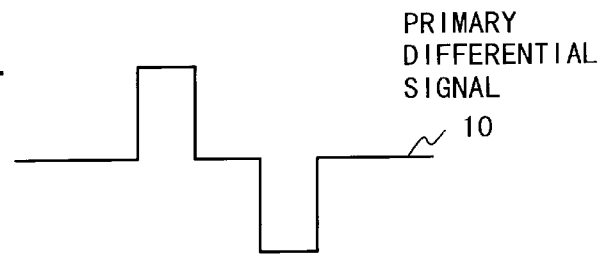
FIGS. 2C and 2D are diagrams illustrating signals when the original signal of FIG. 2B is subjected to primary differentiation and secondary differentiation, respectively.
Figure 2D:
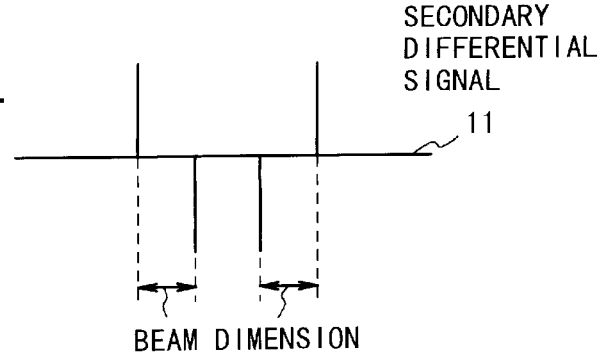
Figure 3:
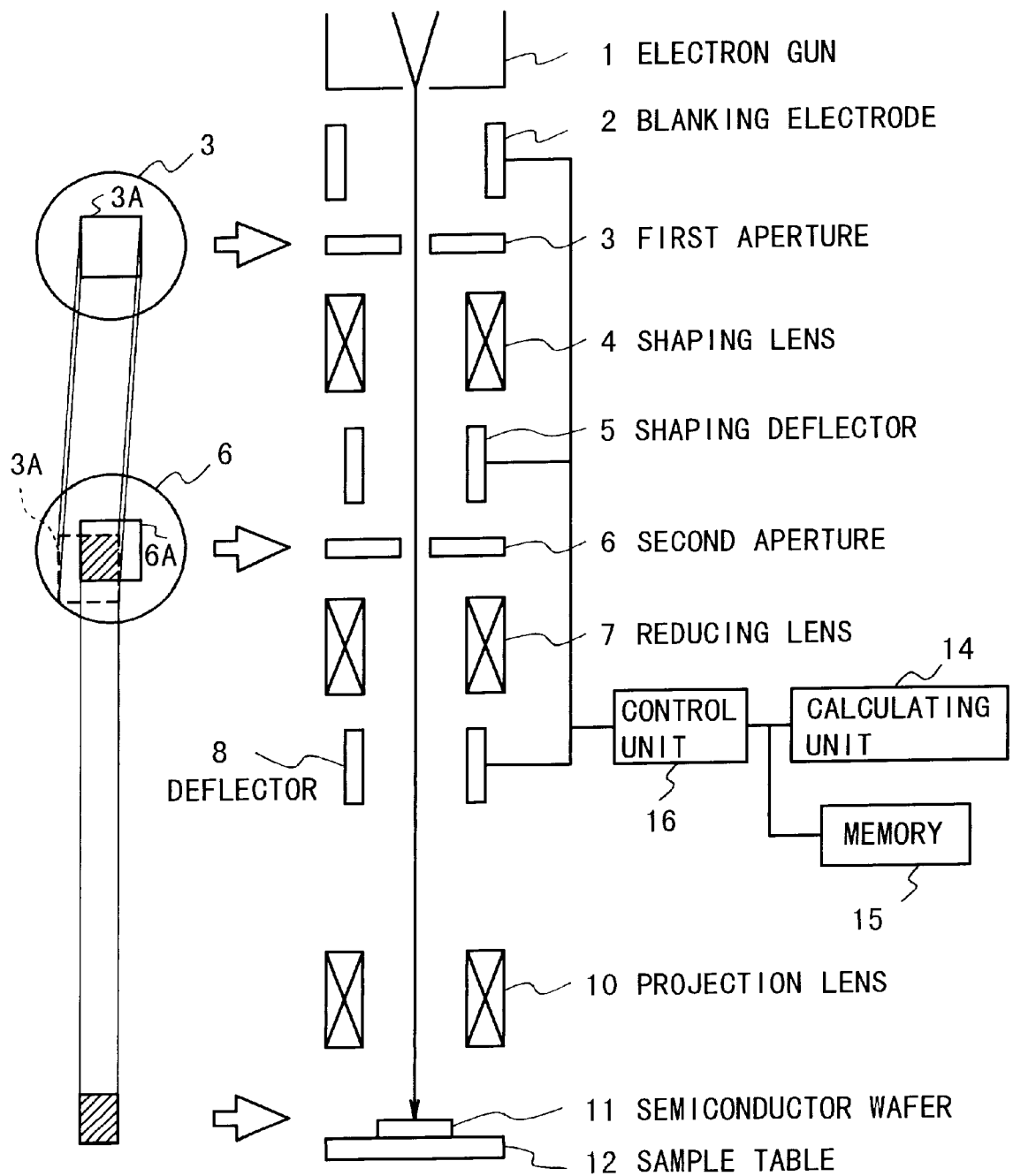
FIG. 3 is a block diagram illustrating the structure of an electron beam exposure system according to the first embodiment of the present invention.

FIG. 3 is a block diagram illustrating an electron beam exposure apparatus which is used in the present invention. The electron beam exposure apparatus is composed of a control system and an optical system.

The control system is composed of a control unit 16, a calculating unit 14 and a memory 15 for storing an offset data table T1 and pattern data. The optical system is composed of an electron gun 1, a blanking electrode 2, a first aperture 3, a shaping lens 4, a shaping deflector 5, a second aperture 6, a reducing lens 7, a deflector 8, a projection lens 10 and a sample table 12. A semiconductor wafer with a resist film is located on the sample table 12.

The calculating unit 14 perform a dividing process of a desired pattern to be exposed into a plurality of subpatterns, a size checking process, a determining process of an offset data by referring to the memory 15, and an adding process to determine and set a usable electron beam condition. The control unit 16 controls the blanking electrode 2, the shaped deflector 5, and the deflector 8 based on the use electron beam condition.

An electron beam generated by the electron gun 1 is controlled by the blanking electrode 2. The basic size of the electron beam is determined by the first and second apertures 3 and 5 under control of the shaping deflector 5 by the control unit 16. The irradiation position of the electron beam is controlled by the deflector 8 through the reducing lens 7 and the projection lens 10.

Figure 4:
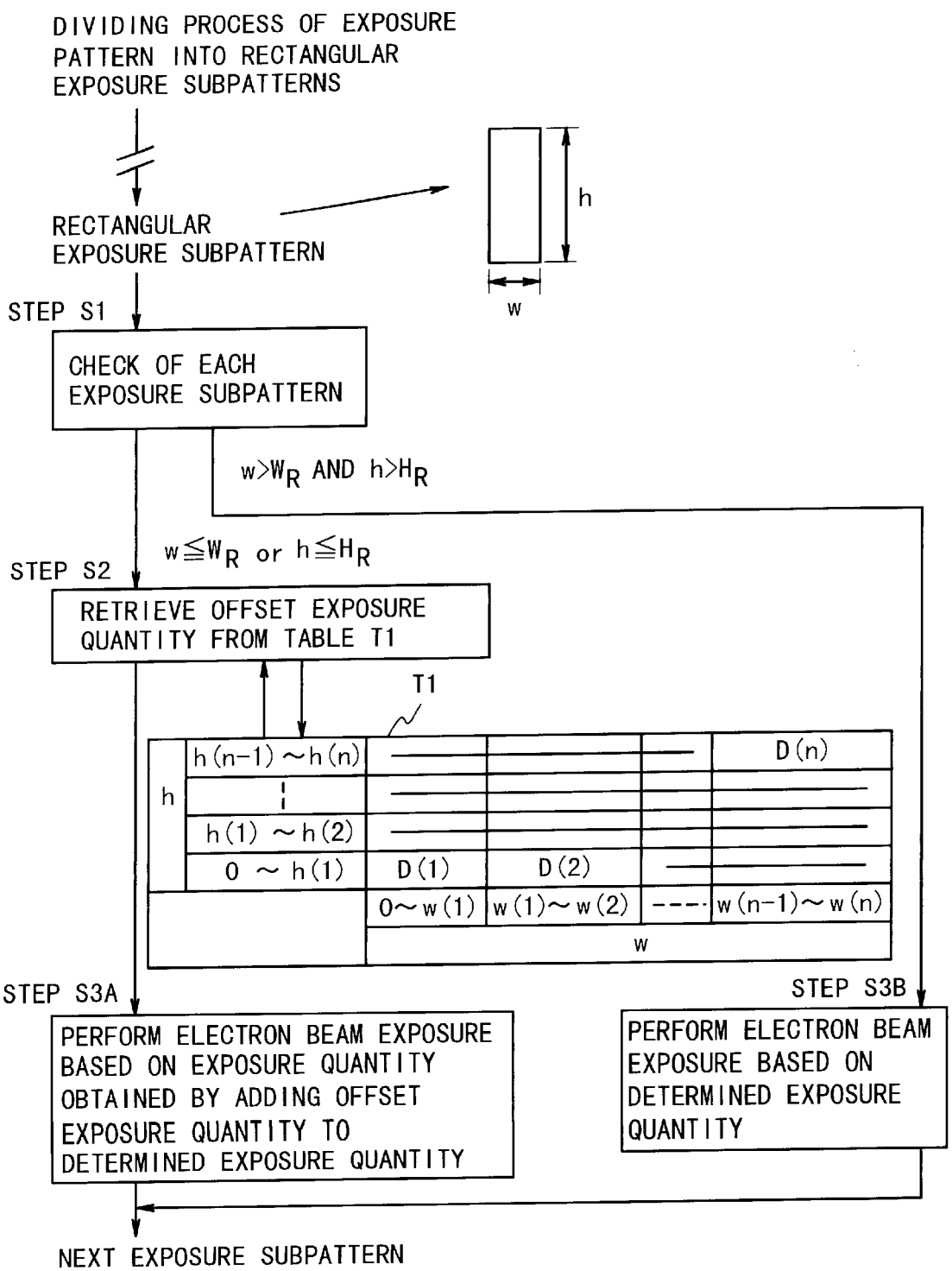
FIG. 4 is a diagram to explain the operation of the electron beam exposure system according to the first embodiment of the present invention.

Next, the pattern drawing method will be described below. FIG. 4 shows a flow of the pattern drawing method according to the first embodiment of the present invention.

Figure 5A:
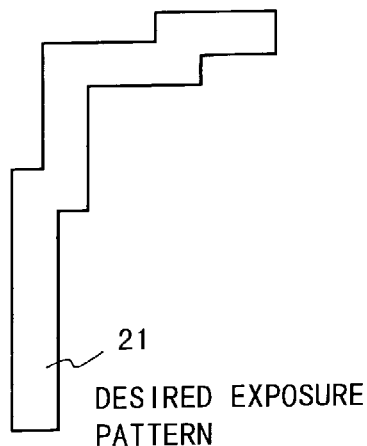
FIG. 5A is a diagram illustrating a desired pattern.
Figure 5B:
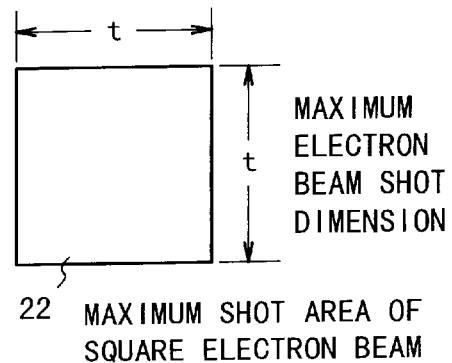
FIG. 5B is a diagram illustrating the maximum shot size of an electron beam in an electron beam exposure system.

FIG. 5A shows a desired exposure pattern 21 to be exposed. FIG. 5B shows a maximum shot 22 of an electron beam peculiar to the electron beam exposure apparatus. The maximum shot is square in this example and has t $\mu$m×t $\mu$m in dimensions.

Figure 5C:
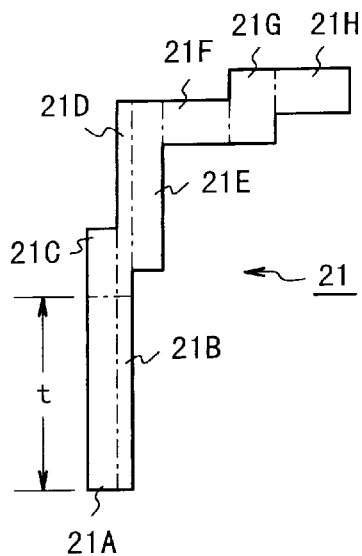
FIG. 5C is a diagram illustrating the state in which the desired pattern is divided into a plurality of rectangular patterns in the electron beam exposure system.
Figure 5D:
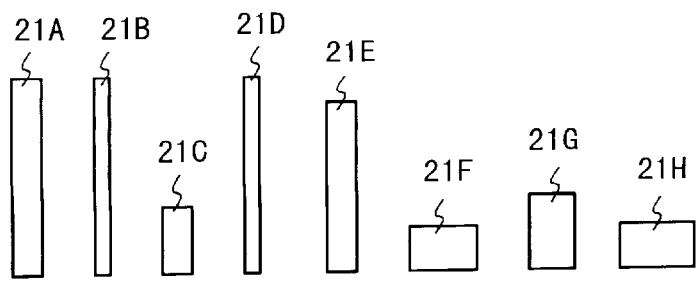
FIG. 5D is a diagram illustrating a sequence of rectangular patterns when the patterns appear.

In a case where the desired exposure pattern 21 shown in FIG. 5A is exposed using a variably shaped electron beam, the desired exposure pattern 21 is divided into a plurality of exposure subpatterns. Ones of the plurality of exposure subpatterns have a dimension smaller than the dimension of t $\mu$m of the maximum shot. In other words, when the size of exposure pattern 21 is larger than the maximum shot size so that the exposure pattern 21 can not be exposed only once, the exposure pattern 21 is divided into rectangular exposure subpatterns 21A, 21B, 21C, 21D, 21E, 21F, 21G, and 21H. These exposure subpatterns have a dimension smaller than a dimension of the maximum shot in this case, as shown in FIG. 5C. These exposure subpatterns are exposed by a rectangular electron beam with the size smaller than the maximum shot size in this order shown in FIG. 5D.

In actual, the pattern dividing process is performed by a rectangular pattern dividing unit or shot dissolving unit (not shown) of a calculating unit 14 when the designed pattern data is converted into the format peculiar to the electron beam exposure apparatus. That is, the calculating unit 14 refers to the memory 15 to read the designed pattern data for the desired exposure pattern 21 and divides the exposure pattern 21 into the plurality of exposure subpatterns 21A to 21H to store them in the memory 17.

Then, the drawing process according to the first embodiment of the present invention is performed in accordance with the procedure shown in FIG. 4 to each of the rectangular exposure subpatterns 21A to 21H.

First, in a step S1, the rectangular exposure subpatterns 21A to 21H are sequentially selected one by one and read out from the memory 15. The size (width w and height h) checking of each of the selected rectangular exposure subpattern is performed to determine whether the width w and height h of the selected exposure subpattern are not smaller than the dimensions, i.e., a reference width $W_R$ and a reference height $H_R$ of a reference electron beam. The dimensions of the reference electron beam are previously determined based on an acceleration voltage of the electron gun 1 and a design line width.

When the width w and height h of the exposure subpattern are not both smaller than the width $W_R$ and height $H_R$ of the reference electron beam, it is determined that the lack of the exposure is not caused. Thus, using the reference electron beam, the exposure is performed with a standard exposure quantity for the reference electron beam in a step S3B.

On the other hand, when either or both of the width w and height h of the exposure subpattern are smaller than the width $W_R$ and height $H_R$ of the reference electron beam, it is determined that the lack of the exposure is caused. Therefore, the calculating unit 14 refers to the offset exposure quantity table T1 to read the offset exposure quantity D(m) corresponding to the width $W_R$ and height $H_R$ of the reference electron beam in a step S2.

The offset exposure quantity table T1 in the memory 15 stores an offset exposure quantity data D(1), . . . , or D(n) in association with the width $W_R$ and height $H_R$ of the selected exposure pattern. For instance, in this example, an offset exposure quantity data D(2) is selected from the table T1 when the width is less than h(1) and the height h is equal to or larger than w(1) and less than w(1). Also, the beam size and exposure quantity for the selected exposure subpattern are previously determined by an extrapolating method using those for various line widths. Therefore, the selected offset exposure quantity D(m) is added to the exposure quantity previously determined based on the reference pattern width and the acceleration voltage. Thus, an electron beam exposure condition is determined. Subsequently, the electron beam exposure is performed based on the electron beam exposure condition in a step S3A.

In this case, the electron beam exposure quantity may be increased by increasing current flowing through the electron gun 1. However, when the current is increased, the stable operation of the electron beam exposure apparatus becomes difficult. Therefore, the time period of the electron beam exposure is generally controlled.

Also, when only one of the dimensions of the rectangular exposure subpattern is smaller than the corresponding dimension of the reference electron beam, it is assumed that the other dimension of the exposure subpattern is identical to the corresponding dimension of the use electron beam and the offset exposure quantity is selected for the one dimension of the exposure subpattern.

Hereinafter, the same process is repeated to the last exposure subpattern.

The offset exposure quantity will be described below in a specific example.

Figure 6:
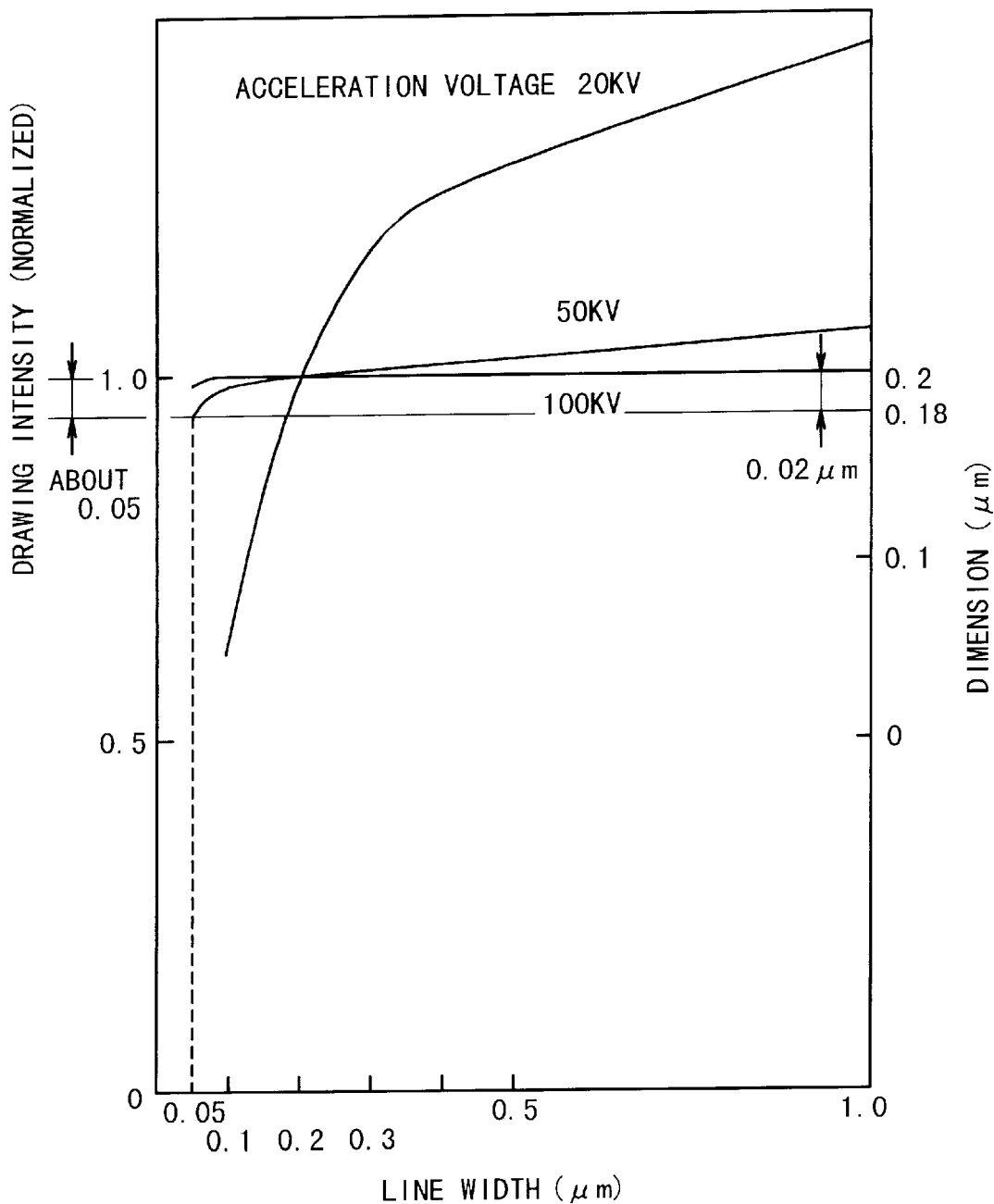
FIG. 6 is a graph illustrating a relation between a line width and an exposure light intensity.

FIG. 6 is a graph illustrating relation between the line width (horizontal axis) when an electron beam exposure is actually performed with a reference exposure quantity of 1.0, and the drawing intensity (the left side vertical axis and the value to have been normalized) or the dimension (the right side vertical axis). In this example, the reference exposure quantity is an exposure quantity which is required to expose an isolated line pattern with the width of 0.2 μm as design line width.

It is assumed that the acceleration voltage of the electron beam is 50 kV, and an actual exposure intensity is about 0.95 in a line pattern thinner than 0.2 μm, e.g., in a line pattern with the line width of 0.05 μm. In this case, the beam size for the line pattern with the line width of 0.05 μm is estimated. The exposure quantity for the line pattern with the line width of 0.2 μm is maintained. In this case, the exposure quantity of about 0.05 (5%) is lack in intensity. Therefore, in this case, the offset exposure quantity of 0.05, i.e., 5% of the exposure quantity for the estimated electron beam as a reference exposure quantity is determined.

Also, in this case, an offset beam size is possible to be considered as in the offset exposure quantity. That is, the offset beam size of 0.02 μm is determined in this case. In other words, as the determining procedure of the offset exposure quantity, the relation of the beam size and the drawing strength is determined as shown by the graph of FIG. 6, and the offset exposure quantities are determined or estimated for every line width in conjunction with acceleration voltage. The determined offset exposure quantities are previously stored in the above able T1.

Next, in the above example, the dimension of a used electron beam is set to be 0.2 μm as a design line width. When one dimension of each of the exposure subpatterns 21A, 21B, 21C, 21D, 21E, 21F, 21G, and 21H is smaller than 0.2 μm, e.g., the dimension is 0.05 μm, the exposure apparatus is controlled to form a reference electron beam for the line width of 0.05 μm. Then, one of the offset exposure quantities D(1), . . . , and D(n) is selected from the table T1 in accordance with the dimensions of the exposure subpattern. Then, the exposure is performed with the value obtained by adding the offset exposure quantity to the reference exposure quantity of the reference electron beam.

Therefore, in the electron beam exposure method of this embodiment, even when a small exposure subpattern is exposed, the exposure quantity lack which causes photoresist resolution degradation can be easily avoided. As a result, even if the pattern with a design dimension of equal to or thinner than, for example, 0.2 μm is required to be exposed with the high integration and fine processing of a semiconductor device, the pattern resolution and the size precision can be sufficiently improved compared with the conventional method.

Figure 7:
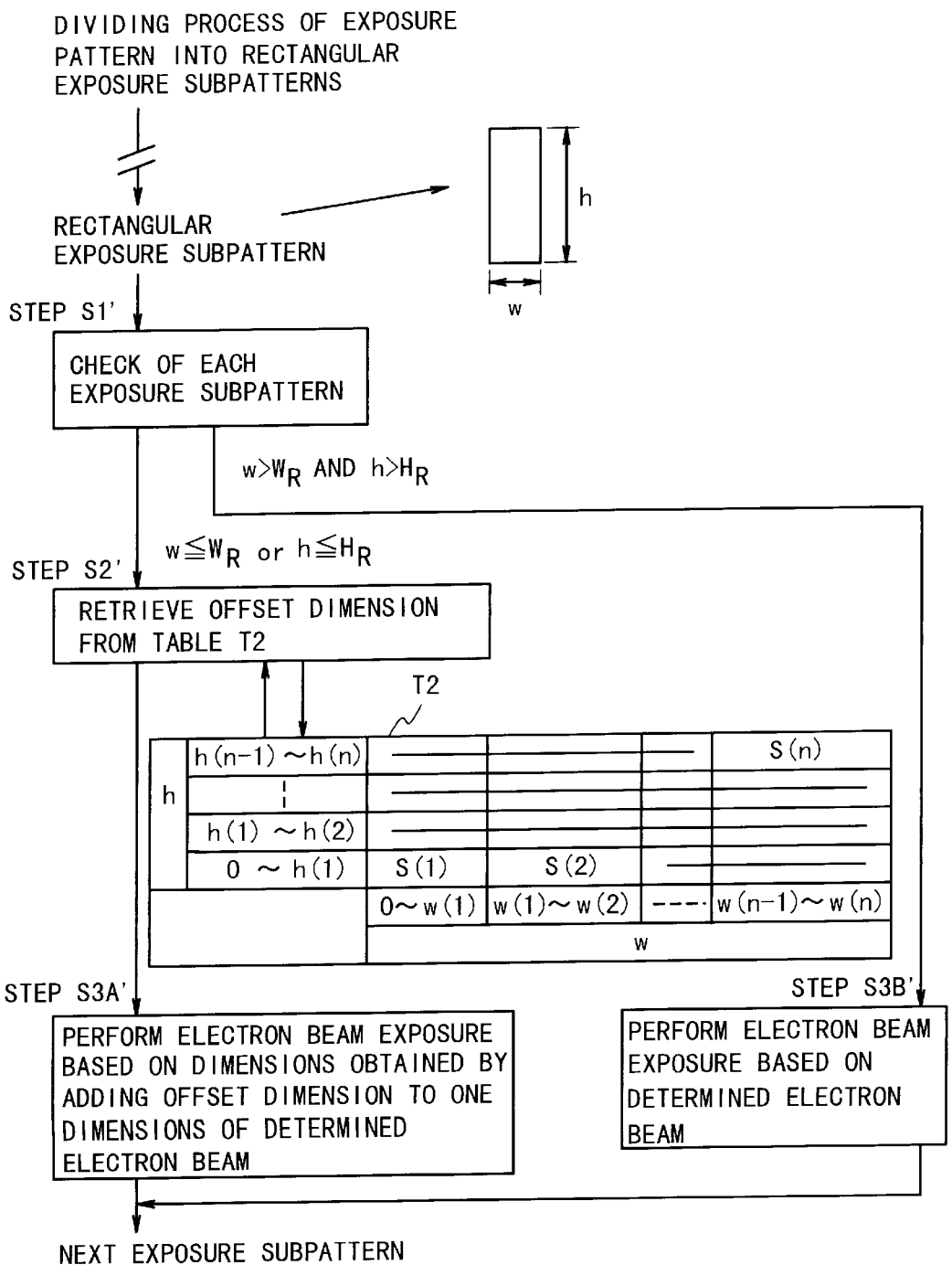
FIG. 7 is a diagram to explain the operation of the electron beam exposure system according to the second embodiment of the present invention.

Next, the electron beam exposure method according to the second embodiment of the present invention will be described. FIG. 7 shows the electron beam exposure method in the second embodiment.

In the electron beam exposure apparatus in the second embodiment, the division of the rectangle pattern into a plurality of exposure subpatterns is same as in the first embodiment. Therefore, the explanation of the pattern dividing process is omitted, and only the procedure of exposure will be described with reference to FIG. 7.

First, in a step S1', the size (width w and height h) checking of each of the rectangular exposure subpatterns are performed to determine whether the width w and height h of the exposure subpattern are not smaller than the width $W_R$ and height $H_R$ of a reference electron beam for a design line width of 0.2 μm. The width $W_R$ and height $H_R$ of the reference electron beam are determined based on an acceleration voltage of the electron gun 1 and a design pattern width. When the width w and height h of the exposure subpattern are not both smaller than the width $W_R$ and height $H_R$ of the reference electron beam, it is determined that the lack of the exposure is not caused. Thus, using the reference electron beam, the exposure is performed with a standard exposure quantity for the reference electron beam in a step S3B'.

On the other hand, when either or both of the width w and height h of the exposure subpattern are smaller than the width $W_R$ and height $H_R$ of the reference electron beam, it is determined that the lack of the exposure is caused. Therefore, when the dimension of the exposure subpattern is 0.05 μm, the dimensions of an electron beam for the line width of 0.05 μm are estimated. Subsequently, the calculating unit 14 refers to the offset electron beam size table T2 to read the offset electron beam size S(m) corresponding to the width w and height h of the exposure subpattern in a step S2'.

The offset electron beam size table T2 in the memory 15 stores an offset electron beam size data S(1), . . . , S(n) in association with the width w and height h of the exposure subpattern. That is, in this example, an offset electron beam data S(2) is selected from the table T2 when the width is less than h(1) and the height h is equal to or larger than w(1) and less than w(1). Then, the selected offset electron beam size S(m) data is added to the dimension of the estimated electron beam to determine an electron beam exposure condition. Subsequently, the electron beam exposure is performed based on the electron beam exposure condition in a step S3A'.

When only one of the dimensions of the rectangular exposure subpattern is smaller than the corresponding dimension of the reference electron beam, it is assumed that the other dimension of the exposure subpattern is identical to the corresponding dimension of the use electron beam. Thus, the offset beam size data is selected for the one dimension of the exposure subpattern.

More specifically, referring to FIG. 6, when the acceleration voltage of the electron beam is 50 kV, the offset electron beam size of 0.02 μm is determined for the line pattern of 0.05 μm. That is, the offset electron beam dimension is determined every line width. The determined offset electron beam dimensions are previously stored in the above table T2.

Next, in the above example, the dimension of the reference electron beam for the exposure subpatterns 21A, 21B, 21C, 21D, 21E, 21F, 21G, and 21H is set to be 0.2 μm. When one dimension of the exposure subpattern is smaller than 0.2 μm, the dimensions of the electron beam for the exposure subpattern are estimated. Then, the offset electron beam size S(1), . . . , S(n) is selected from the table T2 in accordance with the dimension of the exposure subpattern. Subsequently, the exposure is performed with the value obtained by adding the offset electron beam dimension to the estimated dimensions of the electron beam for the exposure subpattern.

Therefore, in the an electron beam exposure method of this embodiment, even when a small exposure subpattern is exposed, the exposure quantity lack which causes photoresist resolution degradation can be easily avoided, as in the first embodiment. As a result, even if the pattern with a design dimension of equal to or thinner than, for example, 0.2 μm is required to be exposed with the high integration and fine processing of a semiconductor device, the pattern resolution and the size precision can be sufficiently improved compared with the conventional method.

In the above description, the exposure is performed for every exposure subpattern. However, after the offset exposure quantities or offset beam sizes for all the exposure subpatterns are retrieved to determined the exposure condition, the exposure may be collectively performed.

It should be noted that the present invention is not limited to the above embodiments. Various modifications can be made in the scope without depart from the sprits of the present invention. For example, in the above embodiments, the offset data is selected from the offset exposure quantity table or the offset electron beam size table. However, instead of the method of using such a table, the relation between the line width and the drawing intensity or the electron beam size may be stored in the memory as a function, as shown in FIG. 3. In this case, the offset exposure quantity or the offset electron beam size may be calculated from the line width of the small rectangular exposure subpattern. According to such a structure, the fine adjustment with exposure quantity or the electron beam size becomes possible.

As described above, according to the present invention, in the method of exposing or drawing a pattern using a variably shaped electron beam, even if a small rectangular pattern is exposed, the exposure quantity lack which causes photoresist resolution degradation can be easily avoided.

Therefore, even if the pattern with the fine design dimension equal to or thinner than, for example, 0.2 μm is required to be exposed with the high integration and fine processing of a semiconductor device, the pattern resolution and the size precision can be sufficiently improved compared with the conventional examples.

What is claimed is:

1. A method of drawing patterns by an electron beam exposure apparatus, comprising the steps of:

dividing a target pattern into subpatterns;

sequentially selecting one of said subpatterns;

comparing dimensions of said selected subpattern with dimensions of a reference electron beam which are determined in accordance with design dimensions;

when each of said dimensions of said selected subpattern is larger than a corresponding one of said dimensions of said reference electron beam, determining said reference electron beam as a use electron beam for said selected subpattern and a reference exposure quantity predetermined from the design dimensions as a use exposure quantity;

when at least one of said dimensions of said selected subpattern is not larger than the corresponding one of said dimensions of said reference electron beam, estimating dimensions of said use electron beam for said selected subpattern;

when at least one of said dimensions of said selected subpattern is not larger than the corresponding one of said dimensions of said reference electron beam, determining said use exposure quantity for said selected subpattern based on said estimated dimensions of said use electron beam for said selected subpattern; and irradiating said use electron beam to said selected subpattern with said use exposure quantity.

2. A method according to claim 1, wherein said determining step includes determining an exposure time as said use exposure quantity for said selected subpattern.

3. A method according to claim 2, wherein said use exposure time is determined dependent upon an acceleration voltage of said use electron beam, in addition to said dimensions of said selected subpattern.

4. A method according to claim 1, wherein said determining step includes:

referring to an exposure quantity table based on said dimensions of said selected subpattern to retrieve an offset exposure quantity for said selected subpattern; and adding said offset exposure quantity to said reference exposure quantity to determine said use exposure quantity for said selected subpattern.

5. A method according to claim 1, wherein said determining step includes:

calculating said use exposure quantity based on said dimensions of said selected subpattern and an acceleration voltage of said use electron beam.

6. A method of drawing patterns by an electron beam exposure apparatus, comprising the steps of:

dividing a target pattern into subpatterns;

sequentially selecting one of said subpatterns;

comparing dimensions of said selected subpattern with dimensions of a reference electron beam which are determined in accordance with design dimensions;

when each of said dimensions of said selected subpattern is larger than a corresponding one of said dimensions of said reference electron beam, determining said dimensions of said reference electron beam for said selected subpattern as dimensions of a use electron beam;

when at least one of said dimensions of said selected subpattern is not larger than the corresponding one of said dimensions of said reference electron beam, determining said dimensions of said use electron beam based on said selected subpattern; and irradiating said use electron beam to said subpattern.

7. A method according to claim 6, wherein said determining step includes determining said dimensions of said use electron beam for said selected subpattern based on said dimensions of said subpattern and an acceleration voltage of said use electron beam.

8. A method according to claim 6, wherein said determining step includes:

estimating said dimensions of said use electron beam based on said dimensions of said reference electron beam and said dimensions of said selected subpattern;

referring to an offset beam size table based on said dimensions of said selected subpattern to retrieve an offset beam dimension for said selected subpattern; and adding said offset beam dimension to one of said dimensions of said estimated dimensions to determine said dimensions of said use electron beam for said selected subpattern.

9. A method according to claim 6, wherein said determining step includes:

calculating said dimensions of said use electron beam based on said dimensions of said selected subpattern and an acceleration voltage of said use electron beam.

10. A method of drawing patterns by an electron beam exposure apparatus, comprising the steps of:

dividing a target pattern into subpatterns;

estimating an exposure condition of a use electron beam for each of said subpatterns based on dimensions of each of said subpatterns and an acceleration voltage of said use electron beam;

correcting said estimated exposure condition of said use electron beam for each of said subpatterns; and irradiating said subpattern by said use electron beam with said corrected exposure condition.

11. A method according to claim 10, wherein said estimating step includes estimating said exposure condition of said use electron beam for each of said subpatterns based on a calibration exposure condition of a calibration electron beam, which are determined in accordance with design dimensions, in addition to said dimensions of each of said subpatterns and said acceleration voltage of said use electron beam.

12. A method according to claim 11, wherein said exposure condition is an exposure quantity.

13. A method according to claim 12, wherein said estimating step includes:

comparing dimensions of each of said subpatterns with said dimensions of said calibration electron beam;

when at least one of said dimensions of each of said subpatterns is not larger than the corresponding one of said dimensions of said calibration electron beam, estimating said exposure condition of said use electron beam.

14. A method according to claim 13, wherein said estimating step includes determining an exposure time as said exposure quantity for each of said subpatterns.

15. A method according to claim 12, wherein said correcting step includes:

referring to an exposure quantity table based on said dimensions of each of said subpatterns to retrieve an offset exposure quantity for each of said subpatterns; and adding said offset exposure quantity to a calibration exposure quantity to correct said exposure quantity for each of said subpatterns.

16. A method according to claim 11, wherein said exposure condition is dimensions of said use electron beam.

17. A method according to claim 16, wherein said determining step includes:

referring to an offset beam size table based on said dimensions of each of said subpatterns to retrieve an offset beam dimension for each of said subpatterns; and adding said offset beam dimension to one of said dimensions of said estimated dimensions of said use electron beam to correct said dimensions of said use electron beam for each of said subpatterns.

18. A method according to claim 12, wherein said irradiating step includes controlling a deflector based on said exposure quantity.

19. A method according to claim 16, wherein said irradiating step includes controlling an aperture based on said corrected dimensions of said use electron beam.

* * * * *